United States Patent
Kamiya

(10) Patent No.: US 9,960,385 B2
(45) Date of Patent: May 1, 2018

(54) ORGANIC EL DISPLAY DEVICE

(71) Applicant: Japan Display Inc., Minato-ku (JP)

(72) Inventor: Akinori Kamiya, Minato-ku (JP)

(73) Assignee: Japan Display Inc., Minato-ku (JP)

(*) Notice: Subject to any disclaimer, the term of this patent is extended or adjusted under 35 U.S.C. 154(b) by 0 days. days.

(21) Appl. No.: 15/278,731

(22) Filed: Sep. 28, 2016

(65) Prior Publication Data

US 2017/0110686 A1 Apr. 20, 2017

(30) Foreign Application Priority Data

Oct. 14, 2015 (JP) ................................ 2015-203256

(51) Int. Cl.
*H01L 51/52* (2006.01)
*H01L 27/32* (2006.01)

(52) U.S. Cl.
CPC ........ *H01L 51/5253* (2013.01); *H01L 27/322* (2013.01); *H01L 51/5246* (2013.01); *H01L 51/5234* (2013.01); *H01L 2251/303* (2013.01)

(58) Field of Classification Search
CPC ............. H01L 51/5253; H01L 51/5246; H01L 27/322; H01L 2251/303; H01L 27/32; H01L 51/52; H01L 51/56; H01L 27/3211; H01L 51/5234; H01L 27/3251; H01L 27/3276; H01L 51/5221; H01L 51/5243; H01L 27/3213; H01L 51/5044; H01L 2251/558

See application file for complete search history.

(56) References Cited

U.S. PATENT DOCUMENTS

| | | | | |
|---|---|---|---|---|
| 9,362,520 | B2* | 6/2016 | Sato | ................... H01L 27/3211 |
| 2004/0013866 | A1* | 1/2004 | Sasaki | ................... B01D 53/02 428/304.4 |
| 2011/0175522 | A1* | 7/2011 | Goda | ................... G02B 5/201 313/504 |
| 2012/0261613 | A1 | 10/2012 | Kim et al. | |
| 2013/0068392 | A1 | 3/2013 | Totani | |
| 2013/0313547 | A1 | 11/2013 | Nakano et al. | |
| 2015/0053957 | A1* | 2/2015 | Sato | ................... H01L 27/3244 257/40 |
| 2015/0221895 | A1* | 8/2015 | Sato | ................... H01L 27/3211 257/40 |
| 2015/0280172 | A1* | 10/2015 | Nishinohara | ..... H01L 29/78606 257/40 |
| 2015/0287959 | A1* | 10/2015 | Hanamura | .......... H01L 51/5246 257/40 |

FOREIGN PATENT DOCUMENTS

| | | |
|---|---|---|
| JP | 2010-226530 | 10/2010 |
| JP | 2012-79658 | 4/2012 |
| JP | 2012-206458 | 10/2012 |
| JP | 2013-156281 | 8/2013 |
| JP | 2013-243094 | 12/2013 |
| JP | 2014-159030 | 9/2014 |

* cited by examiner

Primary Examiner — Thanh T Nguyen
(74) Attorney, Agent, or Firm — Oblon, McClelland, Maier & Neustadt, L.L.P.

(57) ABSTRACT

Due to insufficient moisture inside a panel it may take a long time for a screening. An organic EL display device includes a light emitting region including a lower electrode, an organic EL layer, and an upper electrode, a barrier film formed so as to cover the light emitting region, and a moisture retaining film which is formed on the barrier film and is moisture retentive.

7 Claims, 4 Drawing Sheets

ORGANIC EL DISPLAY DEVICE

CROSS-REFERENCE TO RELATED APPLICATION

The present application claims priority from Japanese Application JP2015-203256 filed on Oct. 14, 2015. The content of the application is hereby incorporated by reference into this application.

BACKGROUND OF THE INVENTION

1. Field of the Invention

The present invention relates to an organic EL display device.

2. Description of the Related Art

As to an organic EL (Organic Electro Luminescent) material used for an Organic EL display device, its light emission characteristics of the organic EL material deteriorates if there is moisture, and a dark spot can be generated where the organic EL material is degenerated by the moisture and no longer emits light after a long-time operation. Therefore, it is examined before shipping whether moisture infiltrated inside, for the purpose of preventing a generation of such a dark spot after the device is distributed to the market. For example, JP2012-79658A discloses a technology to provide a pin hole detection layer which changes its color due to a reaction with moisture between an organic EL layer and a barrier film and detect a pin hole in an examination in a factory.

SUMMARY OF THE INVENTION

For example, to perform what is called a screening to examine whether moisture infiltrated inside as above, moisture inside an organic EL panel is used. However, there is a case where that moisture is insufficient and it takes a long time for the screening.

The present invention realizes an organic EL display device which can shorten the time to conduct the screening to see whether moisture infiltrated into an organic EL layer.

(1) An organic EL display device according to the present invention includes a light emitting region including a lower electrode, an organic EL layer, and an upper electrode; a barrier film covering the light emitting region; and a moisture retaining film which is formed over the barrier film and is moisture retentive.

(2) In the organic EL display device according to above (1), the moisture retaining film may be a porous film.

(3) In the organic EL display device according to above (2), the porous film may be formed of SiO.

(4) In the organic EL display device according to above (2), the porous film may be formed of SiO2.

(5) In the organic EL display device according to above (1), the moisture retaining film may be an organic film.

(6) In the organic EL display device according to any of above (1) to (5), the moisture retaining film may extend out of a display region which includes the light emitting region.

(7) The organic EL display device according to above (6) further may include a substrate including the light emitting region and the barrier film; a color filter substrate; and a sealing member which fixes the substrate and the color filter substrate. The moisture retaining film may extend between the sealing member and the barrier film, and an area where the moisture retaining film does not exist may be provided between the sealing member and the barrier film.

DETAILED DESCRIPTION OF THE INVENTION

In the following, a description is given of an embodiment of the present invention with reference to the drawings. It should be noted that, in the following drawings, the same reference symbols are appended to elements that are the same or equivalent, and duplicated explanation is omitted.

Figure 1:
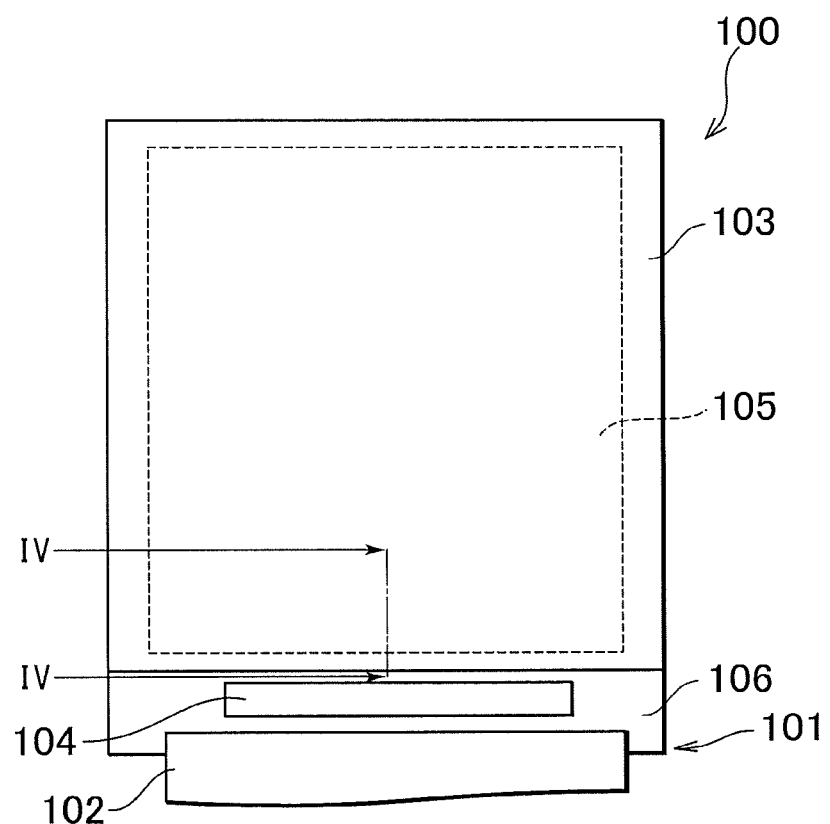
FIG. 1 schematically illustrates an organic EL display device according to an embodiment of this invention FIG. 2 schematically illustrates a circuit configuration of the organic EL display device illustrated in FIG. 1.

FIG. 1 schematically illustrates an organic EL display device according to the present embodiment. As illustrated in FIG. 1, an organic EL display device 100 includes a TFT substrate 101, a flexible circuit substrate 102, an IC (Integrated Circuit) chip 104 disposed on a non-display region 103 of the TFT substrate 101, and a color filter substrate 413 (refer to FIG. 4) disposed opposed to a display region 105 of the TFT substrate 101.

On the TFT substrate 101, a plurality of pixels are arranged in a matrix, as described later. The IC chip 104 is supplied with image data from outside the organic EL display device 100 through the flexible circuit substrate 102. Further, the IC chip 104 is an IC (Integrated Circuit) disposed on the TFT substrate 101. Specifically, the IC chip 104 is disposed on a non-disposition region 106 where the opposing substrate (color filter substrate 413) which is disposed opposed to the TFT substrate 101 is not disposed, out of an upper surface of the TFT substrate 101. Further, the IC chip 104 is connected to a thin film transistor 11 to be described later by a line (not shown) formed in the non-display region 103.

Figure 2:
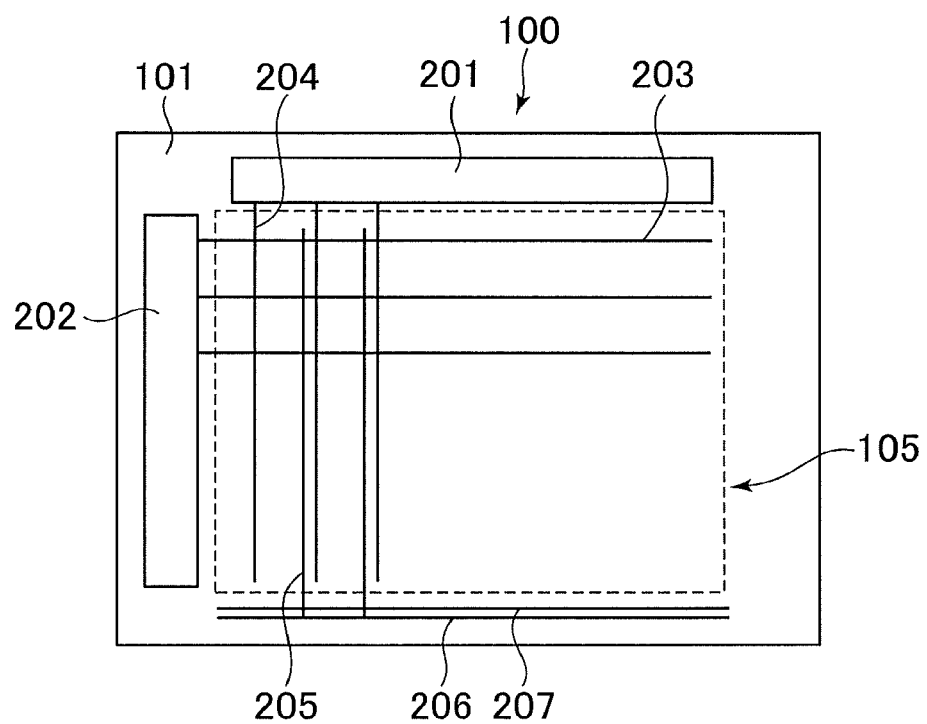

FIG. 2 schematically illustrates a circuit configuration of the organic EL display device illustrated in FIG. 1. The organic EL display device 100 controls respective pixels formed in the display region 105 on the TFT substrate 101 by a data driving circuit 201 and a scan driving circuit 202 to display an image. For example, the data driving circuit 201 is an IC (Integrated Circuit) which generates and transmits a data signal sent to each pixel. The scan driving circuit 202 is an IC which generates and transmits a gate signal for a TFT (Thin Film Transistor) provided in a pixel.

A scanning line 203 that transmits a signal from the scan driving circuit 202 is connected to a gate electrode of a switch transistor 302 to be described later. Further, a data line 204 that transmits a signal from the data driving circuit 201 is connected to a source/drain electrode of the switch transistor 302. A reference electric potential to make an organic light emitting diode 305 emit light is applied to an electric potential line 205. The electric potential line 205 is connected to a source/drain electrode of a driver transistor 301. A first electric potential supplying line 206 and a second electric potential supplying line 207 are connected to an electric potential supply source, and are connected to the electric potential line 205 through transistors. Note that the circuit illustrated in FIG. 2 is merely one example, and the present embodiment is not limited to the above.

Figure 3:
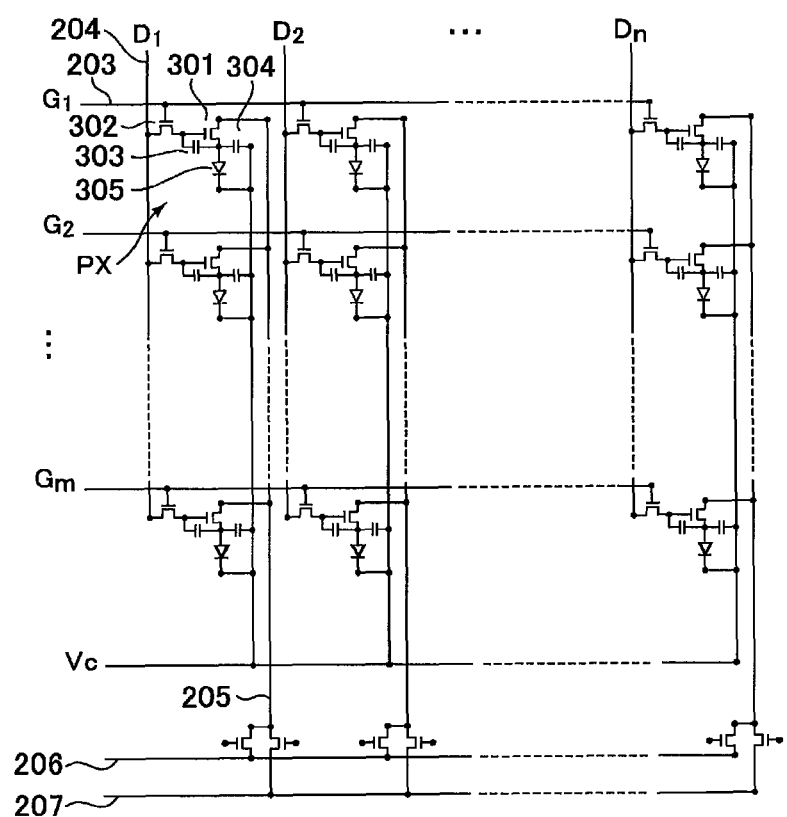
FIG. 3 illustrates one example of a circuit of the organic EL display device illustrated in FIG. 1.

FIG. 3 illustrates one example of a circuit of the organic EL display device illustrated in FIG. 1. The display region 105 of the organic EL display device 100 has data lines 204 and the scan lines 203 formed thereon. The data lines 204 include a first line (D1) to a n-th line (Dn), and the total number of the data lines is n. The scan lines 203 include a first line (G1) to a m-th line (Gm), and the total number of the scanning lines is m. A plurality of pixels PX are arranged in a matrix and arrayed in the extending direction of the scan lines 203 and the extending direction of the data lines 204. For example, a pixel PX is formed in a part surrounded by G1 and G2 and D1 and D2.

The first scan line G1 is connected to the gate electrode of the switch transistor 302. When a signal is applied to the first scan line G1 from the scan driving circuit 202, the switch transistor 302 is turned to the ON state. When a signal is applied from the data driving circuit 201 to the first data line D1, a charge is stored in a storage capacitor 303, and a voltage is applied to a gate electrode of the driver transistor 301, which turns the driver transistor 301 to the ON state. Even when the switch transistor 302 turns to the OFF state, the driver transistor 301 stays in the ON state for a predetermined period due to the charge stored in the storage capacitor 303. The positive electrode of the organic light emitting diode 305 is connected to the electric potential line 205 through the source and the drain of the driver transistor 301, and the negative electrode of the organic light emitting diode 305 is fixed to a reference electric potential Vc. Therefore, an electric current according to the gate voltage of the driver transistor 301 runs in the organic light emitting diode 305, and the organic light emitting diode 305 emits light. Further, an additional capacitor 304 is formed between the positive electrode and the negative electrode of the organic light emitting diode 305. The additional capacitor 304 shows an effect to stabilize the voltage applied to the storage capacitor 303, and contributes to a stable operation of the organic light emitting diode 305. This effect appears by making the capacitance of the additional capacitor 304 larger than that of the storage capacitor 303. Note that the circuit configuration shown in FIG. 3 is merely one example, and the present embodiment is not limited to the above.

Figure 4:
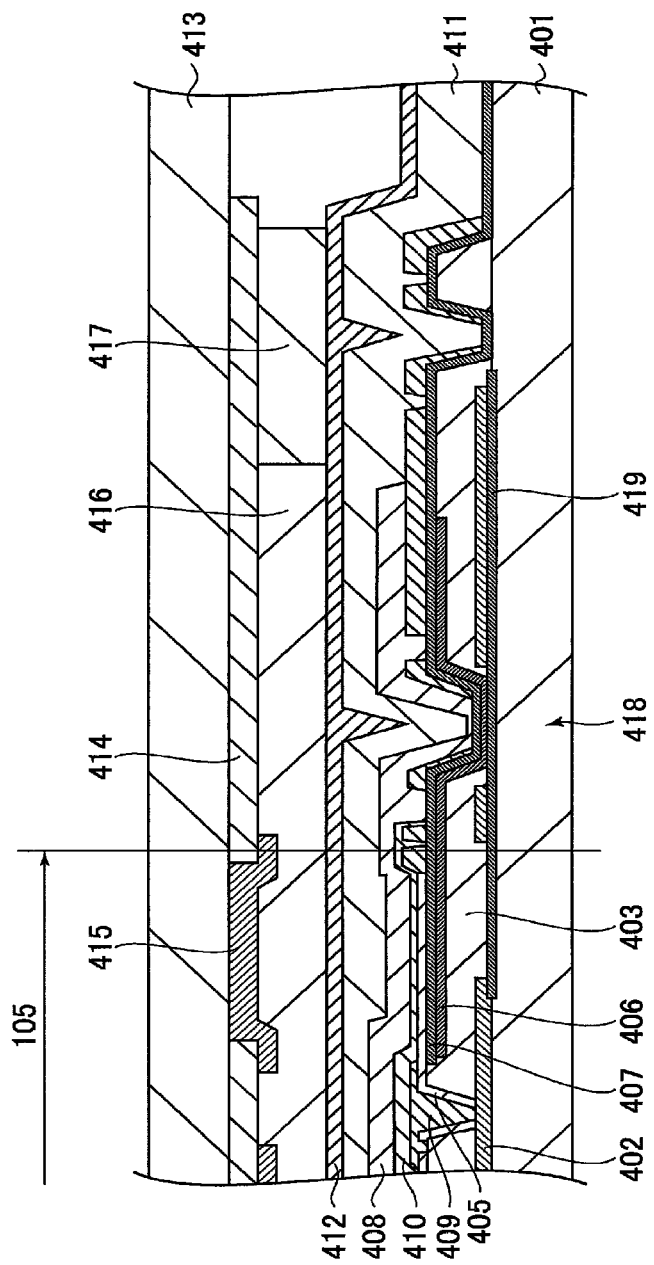
FIG. 4 schematically illustrates IV-IV section of FIG. 1.

FIG. 4 schematically illustrates IV-IV section of FIG. 1. Note that the section shown in FIG. 4 is merely one example, and this embodiment is not limited to this.

As illustrated in FIG. 4, the substrate 401 has a TAT (Ti/Al/Ti) 402 that forms a source electrode and a drain electrode and is disposed in a certain region on the substrate 401. The TAT 402 is a conductive material formed in a three layer structure of Ti, Al and Ti. The source electrode of the driver transistor 301 (refer to FIG. 3) is connected to an anode electrode 405 via a through hole formed in a flat layer 403 formed of HRC (hard resin coat) or the like. In a region located toward a sealing member 417 from the through hole, the TAT 402 is disposed on a predetermined region of the substrate 401 and is formed on an insulation layer 419 that is disposed on the substrate 401.

A metal layer 406, an insulation layer 407 and the anode electrode 405 are formed in order on the flat layer 403 in a predetermined region including a light emitting region to be described later. The metal layer 406 is what is called the 3rd METAL, and is formed of, for example, an ITO (Indium Tin Oxide) layer, an MO layer, an AL layer and the like that are laminated. Further, the metal layer 406 and a cathode electrode 408 to be described later are electrically connected to each other, and thus the metal layer 406 is used as an auxiliary line for the cathode electrode 408. Moreover, the insulation layer 407 is sandwiched between the metal layer 406 and the anode electrode 405, and thus a capacitor layer (the additional capacitor 304) is formed. Note that the connection of the metal layer 406 and the cathode electrode 408 is made by, for example, a through hole formed outside the display region 105.

The insulation layer 407 is formed of, for example, SiN. Further, the anode electrode 405 is formed of, for example, ITO. Note that other materials such as IZO (Indium Zinc Oxide) and ZnO (Zinc Oxide) may be used as a material for the anode electrode 405.

The flat layer 403 has a through hole formed in a part thereof that is located on the TAT 402. The through hole has the anode electrode 405 that is layered on the lateral surface of the through hole. A rib layer 409 which divides pixels is formed over the through hole. A region where the anode electrode 405 and an organic layer 410 are in contact is the light emitting region, and the rib layer 409 defines the outer edge of the light emitting region.

The organic layer 410 is disposed in a predetermined region over the rib layer 409 and the anode electrode 405. Further, the cathode electrode 408 is disposed so as to cover the organic layer 410. The cathode electrode 408 is formed of, for example, a transparent electrode such as ITO and IZO. Further, the cathode electrode 408 may be formed over two or more of the pixels or over all of the pixels arranged in a matrix. Note that the organic layer 410 includes, for example, a hole transfer layer, a light emitting layer, and an electron transfer layer that are arrayed from the side of the anode electrode 405, but a detailed explanation is not given here because it is well known.

A barrier film 411 is formed on the cathode electrode 408. A moisture retaining film 412 which is moisture retentive is formed on the barrier film 411. The moisture retaining film 412 is formed of, for example, a porous film. More specifically, it is formed of, for example, SiO and/or SiO2. Further, the moisture retaining film 412 may be formed of, for example, an organic film. Note that the moisture retaining film 412 may be formed of other materials as long as it is moisture retentive. Further, it is sufficient that the thickness of the moisture retaining film 412 is, for example, around 1 μm.

The color filter substrate 413 has a black matrix 414 and a color filter 415. A filler 416 is filled between the color filter substrate 413 and the TFT substrate 101 where the moisture retaining film 412 or the like are formed. Further, on the edge of the color filter substrate 413, the sealing member 417 is disposed.

The above moisture retaining film 412 is, as illustrated in FIG. 4, formed so as to extend out of the display region 105, for example. Specifically, for example, the moisture retaining film 412 reaches outside the sealing member 417, extending over the organic layer 410 and under the sealing member 417. It is favorable that an area where no moisture retaining film 412 exists is provided between the sealing member 417 and the barrier film 411, and the moisture retaining film 412 extends between the sealing member 417 and the barrier film 411 out of that region. For example, the sealing member 417 may have, at its part such as a corner part, an area that has no moisture retaining film 412 thereunder. Due to such an arrangement, an adhesion of the sealing member 417 and the barrier film 411 can be improved.

Note that as illustrated in FIG. 4, a moisture blocking structure 418 may be formed in the rib layer 409, the barrier film 411 and the like, and be located under the sealing member 417 or between the display region 105 and the sealing member 417. That moisture blocking structure 418 is a structure to prevent an infiltration of moisture into the organic layer 410 from the external side. The moisture blocking structure 418 illustrated in FIG. 4 is merely one example, and it is not limited thereto. Further, an arrangement of the organic EL display device 100 is merely an example, and the present embodiment is not limited to the arrangement illustrated in FIG. 4.

Next, explained is a work of the moisture retaining film 412 in a screening of the organic EL display device 100 in the present embodiment. As described above, for the organic EL display device 100, what is called screening in which whether moisture has infiltrated inside is examined is performed before its shipment to the market. Specifically, the screening is performed using moisture inside a panel that includes the color filter substrate 413 and the TFT substrate 101 on which the moisture retaining film 412 and the like are formed. In the present embodiment, the moisture retaining film 412 contains moisture. Accordingly, enough moisture can by supplied inside the panel for the screening, and an extension of a time period of the screening due to insufficient moisture can be avoided. Specifically, for example, in a case where the moisture retaining film 412 is not provided, it takes about 100 hours for the screening. According to the present embodiment, it can be shortened to about 24 hours.

The present invention is not limited to the above embodiment, and can be substituted with an arrangement which is substantially the same with the arrangement shown in the above embodiment, an arrangement which gives the same working effects, or an arrangement which can achieve the same objective. For example, in the above, an explanation is given of the case in which the moisture retaining film 412 extends outside the sealing member 417 from a part over the organic layer 410. However, the moisture retaining film 412 may be arranged, for example, so that the moisture retaining film 412 does not extend outside and is formed only inside the sealing member 417. Further, the arrangement of the section of the organic EL display device 100 illustrated in FIG. 4 is merely one example, and it may have another arrangement as long as there is the moisture retaining film 412 which is moisture retentive as above. For example, in FIG. 4, the moisture blocking structure 418 or the like which blocks moisture is provided besides the barrier film 411, but it is fine if this moisture blocking structure 418 or the like is not provided. Note that the lower electrode and the upper electrode in the claims correspond, for example, to the anode electrode 405 and the cathode electrode 408, respectively.

What is claimed is:

1. An organic EL display device comprising:
   a light emitting region including a lower electrode, an organic EL layer, and an upper electrode;
   a barrier film covering the light emitting region;
   a substrate including the light emitting region and the barrier film;
   a color filter substrate;
   a filler filling between the substrate and the color filter substrate;
   a sealing member which is formed around the filler and fixes the substrate and the color filter substrate; and
   a moisture retaining film which is formed on the barrier film and is moisture retentive;
   wherein
   the moisture retaining film extends between the filler and the barrier film, and extends between the sealing member and the barrier film,
   the moisture retaining film includes a first surface and a second surface, the first surface includes first and second convex portions that project to the barrier film, the first convex portion is formed under the filler, the second convex portion is formed under the sealing member, and
   the second surface is flat at positions where the first and second convex portions are provided respectively.

2. The organic EL display device according to claim 1, wherein the moisture retaining film is a porous film.

3. The organic EL display device according to claim 2, wherein the porous film is formed of SiO.

4. The organic EL display device according to claim 2, wherein the porous film is formed of SiO2.

5. The organic EL display device according to claim 1, wherein the moisture retaining film is an organic film.

6. The organic EL display device according to claim 1, wherein the moisture retaining film extends out of a display region which includes the light emitting region.

7. The organic EL display device according to claim 6, wherein an area where the moisture retaining film does not exist is provided between the sealing member and the barrier film.

* * * * *